United States Patent [19]
Chang et al.

[11] Patent Number: 5,494,838
[45] Date of Patent: Feb. 27, 1996

[54] PROCESS OF MAKING EEPROM MEMORY DEVICE HAVING A SIDEWALL SPACER FLOATING GATE ELECTRODE

[75] Inventors: Kuo-Tung Chang; Umesh Sharma; Jack Higman, all of Austin, Tex.

[73] Assignee: Motorola, Inc., Schaumburg, Ill.

[21] Appl. No.: 448,096

[22] Filed: May 23, 1995

Related U.S. Application Data

[62] Division of Ser. No. 235,994, May 2, 1994, Pat. No. 5,422,504.

[51] Int. Cl.⁶ ................................................. H01L 21/8247
[52] U.S. Cl. ........................... 437/43; 437/44; 437/49
[58] Field of Search ............................. 437/43, 44, 49, 437/195, 984

[56] References Cited

U.S. PATENT DOCUMENTS

| | | | |
|---|---|---|---|
| 5,020,030 | 5/1991 | Huber | 365/185 |
| 5,051,793 | 9/1991 | Wang | 357/23.5 |
| 5,063,172 | 11/1991 | Manley | 437/43 |
| 5,108,939 | 4/1992 | Manley et al. | 437/43 |
| 5,194,925 | 3/1993 | Ajika et al. | 257/314 |
| 5,225,362 | 7/1993 | Bergemont | 437/43 |
| 5,296,396 | 3/1994 | Bellezza | 437/43 |
| 5,338,952 | 8/1994 | Yamauchi | 257/315 |

FOREIGN PATENT DOCUMENTS

| | | |
|---|---|---|
| 62-43179 | 2/1987 | Japan. |
| 63-45862 | 2/1988 | Japan. |

OTHER PUBLICATIONS

Yamauchi, et al., "A 5V-Only Virtual Ground Flash Cell with an Auxiliary Gate for High Density and High Speed Application", IEEE Sep. 1991, pp. 319–322.

*Primary Examiner*—Chandra Chaudhari
*Attorney, Agent, or Firm*—Kent J. Cooper

[57] ABSTRACT

An EEPROM memory array includes a plurality of memory cells having a floating gate electrode (22) formed as a sidewall spacer adjacent to a control gate electrode (20). Source and drain regions (12, 14) reside in a semiconductor substrate (10) and define a segmented channel region (16) therebetween. A select gate electrode (18) overlies a first channel region (24) and separates the floating gate electrode (2) from the source region (12). The control gate electrode (20) overlies a third channel region (28) and separates the floating gate electrode (22) from the drain region (14). The floating gate electrode (22) overlies a second channel region (26) and is separated therefrom by a thin tunnel oxide layer (42). The EEPROM device of the invention can be programmed by either source side injection, or by Fowler-Nordheim tunneling. Additionally, a process is provided for the fabrication of an EEPROM array utilizing adjacent select gate electrodes (18, 18') as a doping mask.

4 Claims, 4 Drawing Sheets

PROCESS OF MAKING EEPROM MEMORY DEVICE HAVING A SIDEWALL SPACER FLOATING GATE ELECTRODE

This is a division of application Ser. No. 08/235,994, now U.S. Pat. 5,422,904, filed May 2, 1994.

RELATED APPLCATIONS

This application is related to subject matter disclosed in commonly assigned, copending, patent applications having docket number SC02205A and Ser. No. 08/223,354, now U.S. Pat. No. 5,467,308, and docket number SC02206A and Ser. No. 08/223,395, now U.S. Pat. No. 5,408,115.

FIELD OF THE INVENTION

This invention relates in general to non-volatile memory devices and to methods of fabrication, and more particularly to EEPROM devices capable of low voltage operation.

BACKGROUND OF THE INVENTION

State of the art non-volatile memory devices are typically constructed by fabricating a field effect transistor in a silicon substrate. The field effect transistor is capable of storing electrical charge either in a separate gate electrode, known as a floating gate, or in a dielectric layer underlying a control gate electrode. Data is stored in a non-volatile memory device by changing the threshold voltage of the field effect transistor through the storage of electrical charge over the channel region of the substrate. For example, in an n-channel enhancement device, an accumulation of electrons in a floating gate electrode, or in a dielectric layer overlying the channel region, creates a high threshold voltage in the field effect transistor. When the control gate is grounded, current will not flow through the transistor, which is defined as a logic 0 state. Conversely, a reduction in the negative charge over the channel region creates a low threshold voltage, possibly negative. In this condition, with the control gate grounded, current will flow through the field effect transistor, which is defined as a logic 1 state.

One particular type of non-volatile memory device is the flash EEPROM (electrically-erasable-programmable-read-only-memory). Flash EEPROMs are a type of device which provide electrical erasing capability. The term "flash" refers to the ability to erase the memory cells simultaneously with electrical pulses. In an erased state, the threshold voltage of the field effect transistor is low and electrical current can flow through the transistor indicating a logic 1 state.

In a flash EEPROM device, electrons are transferred to the floating gate electrode through a dielectric layer overlying the channel region of the enhancement transistor. The electron transfer is initiated by either hot electron injection, or by Fowler-Nordheim tunneling. In either electron transfer mechanism, a voltage is coupled to the floating gate by an overlying control gate electrode. The control gate electrode is capacitively coupled to the floating gate electrode, such that a voltage applied on the control gate electrode is coupled to the floating gate electrode. The flash EEPROM device is programmed by applying a high positive voltage to the control gate electrode and a lower positive voltage to the drain region, which transfers electrons from the channel region to the floating gate electrode. The EEPROM device is erased by grounding the control gate electrode, and applying a high positive voltage to either the source or drain region of the enhancement transistor. Under erase voltage conditions, electrons are removed from the floating gate electrode and into either the source or drain regions in the semiconductor substrate.

In order to obtain increased programming efficiency, EEPROM devices using hot electron injection have been developed that can be programmed by source-side injection. To program an EEPROM device using source-side injection, a select gate electrode is formed overlying a portion of the channel region adjacent to the source region. The select gate electrode is electrically isolated from the control gate electrode, which is formed adjacent to the drain region. During programming, an electric field gradient is established in the channel region such that electrons originating in the source region are accelerated across a potential drop, and are injected onto a floating gate electrode. Programming by source side injection is carried out a low current levels, which permits EEPROM cells to be programmed by charge pumping from a single, low-voltage power supply. Additionally, it has been demonstrated that source-side injection can be many times more efficient than drain side injection. The higher efficiency reduces the amount of time necessary to perform a programming operation.

While programming with sourceside injection, or Fowler-Nordheim tunneling, increases programming efficiency, high-density EEPROM arrays suffer from drain disturbance conditions in cells adjacent to the programmed cell. The access of a certain memory cell is achieved by selecting one bit-line and one word-line, and the cell at the cross point of the selected bit-line and word-line is selected. During programming of the selected cell, a high-positive voltage is applied to both the selected bit-line and selected word-line. However, other memory cells, which are connected to the selected bit-line but on unselected word-lines, are subjected to a high drain voltage with a grounded gate electrode. This is an erase condition which can discharge the floating gate electrodes in unselected cells. The drain disturb condition is aggravated in high-density arrays which place the drain region adjacent to the floating gate electrode. Accordingly, further development of EEPROM arrays is necessary to provide enhanced programming capability, while avoiding drain disturbance conditions.

SUMMARY OF THE INVENTION

In practicing the present invention there is provided an EEPROM memory array including a plurality of memory cells where each memory cell has a floating gate electrode formed as a sidewall spacer adjacent to the control gate electrode and spaced away from the source region by a select gate electrode, and from the drain region by the control gate electrode. The formation of the floating gate electrode using sidewall spacer technology provides a high density EEPROM array with improved immunity to disturbance conditions during operation of the array.

Each memory cell includes an active region in a semiconductor substrate intermediate to a source region and a drain region and segmented into first, second, and third channel regions. A select gate electrode overlies the first channel region and is separated from the channel region by a first dielectric layer. A control gate electrode overlies the third channel region and is separated from the third channel region by a second dielectric layer. A sidewall spacer adjacent to the control gate electrode overlies the second channel region and separates the select gate electrode from the control gate electrode at the active region. The sidewall spacer is displaced away from the source region by the select gate electrode, and is separated from the second channel region by a tunnel oxide layer. The sidewall spacer functions as a floating gate electrode, such that electrons traversing the tunnel oxide layer are stored in the sidewall spacer.

A process for fabricating an EEPROM array in accordance with the invention includes the formation of first and second oxide encapsulated control gate electrodes overlying an active region of a semiconductor substrate. A tunnel oxide layer is formed to overlie a region of the substrate surface intermediate to the first and second control gate electrodes. Floating gate sidewall spacers are formed adjacent to the first and second control gate electrodes, and overlie a portion of the tunnel oxide layer. An insulating layer is formed to overlie the first and second control gate electrodes, and the floating gate sidewall spacers. Next, first and second select gate electrodes are formed intermediate to the sidewall spacers, and are separated from the sidewall spacers by the insulating layer. Finally, a doped region is formed in the substrate intermediate to the first and second control gate electrodes. The control gate electrodes are used as a doping mask to align the doped region in the substrate to the edges of the first and second select gate electrodes.

Figure 1:
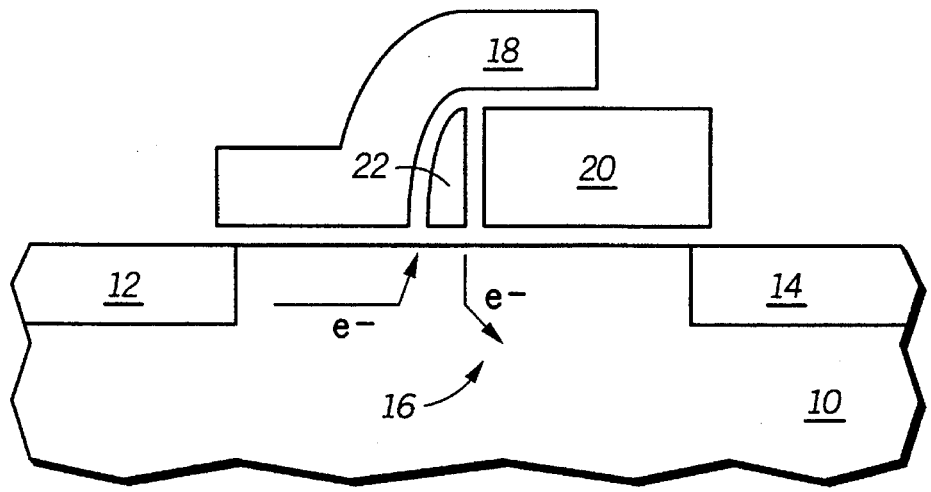
FIG. 1 illustrates, in cross-section, an EEPROM device arranged in accordance with the invention.

It will be appreciated that for simplicity and clarity of illustration, elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF PREFERRED EMBODIMENTS

The present invention provides an EEPROM device which is capable of being programmed and erased by using a single, low-voltage power supply. Additionally, the EEPROM device of the invention incorporates sidewall spacer fabrication techniques to achieve a high-density non-volatile memory cell having a split-gate configuration. The EEPROM device of the invention provides a high gate coupling ratio through the fabrication of a floating gate electrode, which is formed as a sidewall spacer adjacent to the control gate electrode. The sidewall spacer floating gate electrode separates the select gate electrode from the control gate electrode at the substrate surface. The gate electrodes of the EEPROM device are arranged such that the floating gate electrode is spaced away from the source and drain regions by both the select gate electrode and the control gate electrode. By positioning the floating gate electrode over a central portion of the channel region, the performance of the EEPROM device is substantially improved.

In addition to avoiding the problem Of a drain disturb condition when programming operations are performed in adjacent memory cells, the positioning of the floating gate electrode in a central portion of the channel region allows the EEPROM device to be programmed using either source side injection or Fowler-Nordheim tunneling. Additionally, the utilization of sidewall spacer technology for the formation of the floating gate electrode, and in an alternative embodiment, also the select gate electrode, reduces the size of individual memory cells in an EEPROM memory array.

Shown in FIG. 1, in cross-section, is an EEPROM device formed in accordance with one embodiment of the invention. A semiconductor substrate 10 includes a source region 12 and a drain region 14 separated by a channel region 16. A select gate electrode 18 overlies a first portion of the channel region and is separated from a control gate electrode 20 at the substrate surface by a floating gate electrode 22. The floating gate electrode overlies a second portion of the channel region, and the control gate electrode overlies a third portion of the channel region.

Figure 2:
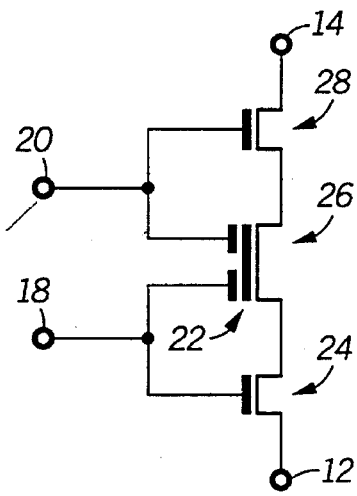
FIG. 2 is a circuit diagram of the EEPROM device illustrated in FIG. 1.

A circuit diagram of the EEPROM device shown in FIG. 1 is illustrated in FIG. 2. The positioning of the gate electrodes over channel region 16 segments channel region 16 into three separate conductive channels connected to each other in series. Select gate electrode 18 electrically controls a first channel region 24. Programming and erasing of the EEPROM device is carried out by either injecting electrons, or tunneling electrons, from a second channel region 26 into floating gate electrode 22. A third channel region 28 is electrically controlled by control gate electrode 22. In addition to controlling the potential of the floating gate electrode, control gate electrode 22 functions to transfer drain voltage from drain region 14 across channel region 28 to channel region 26 during programming of the EEPROM device. Select gate electrode 18 controls programming current by regulating the current flow through channel region 24 during programming of the device. Additionally, select gate 18 prevents current flow through the EEPROM device while data from adjacent memory cells is accessed during a read operation.

In one embodiment of the invention, as depicted in FIG. 1, the EEPROM device is programmed by source side injection under the application of positive voltage levels to the control gate electrode, the select gate electrode, and the drain region, while grounding the source region. Electrons emerge from source region 12, traverse channel region 24, and are injected into floating gate electrode 22. The EEPROM device is erased by applying negative voltages to control gate electrode 20, and to select gate electrode 18, while grounding drain region 14 and source region 12. Under erase conditions, electrons stored in floating gate electrode 22 tunnel through the thin dielectric layer underlying floating gate electrode 22 and into channel region 26.

In an alternative embodiment of the invention, the EEPROM device can be programmed by Fowler-Nordheim tunneling. To program the device by Fowler-Nordheim tunneling, positive voltages are applied to control gate electrode 20 and to select gate electrode 18, while grounding source region 12 and drain region 14. Under the applied voltage conditions, electrons tunnel through the thin dielectric layer between floating gate electrode 22 and channel region 26.

The ability to program the EEPROM device of the invention using either source side injection or Fowler-Nordheim tunneling is realized by the placement of floating gate electrode 22 in a central portion of the channel region. The floating gate electrode electrically controls channel region 26, which is separated from both the source and drain regions by separate channel regions connected in series with channel region 26. As indicated in FIG. 2, channel region 26 can function independently from channel region 24 and channel region 28. The ability of the control gate and select gate electrodes to electrically isolate channel region 26 from source region 12 and drain region 14, permits electrical charge to be transferred to and from floating gate 22 using two different charge transfer mechanisms. Additionally, the displacement of channel region 26 away from drain region 14 avoids drain disturb conditions. By spacing floating gate electrode 22 away from drain region 14, greater electrical resistance is provided between the floating gate and the drain region. When programming operations are initiated in adjacent memory cells and drain region 14 is brought to a positive voltage while control gate electrode 20 is grounded, electrons will not be discharged from floating gate 22 into drain region 14.

Figure 10:
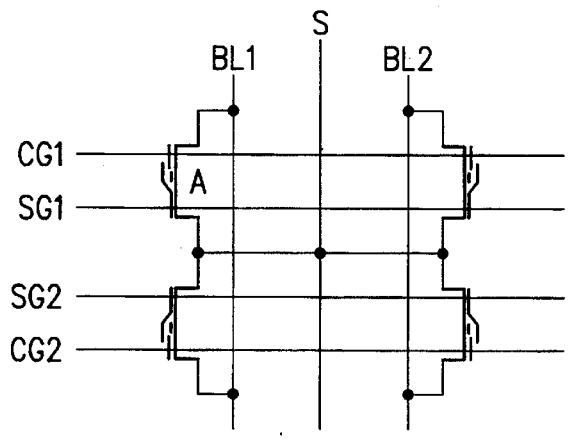
FIG. 10 is a schematic diagram of an EEPROM memory array incorporating the EEPROM device as illustrated in FIG. 8 or FIG. 9.
Figure 11:
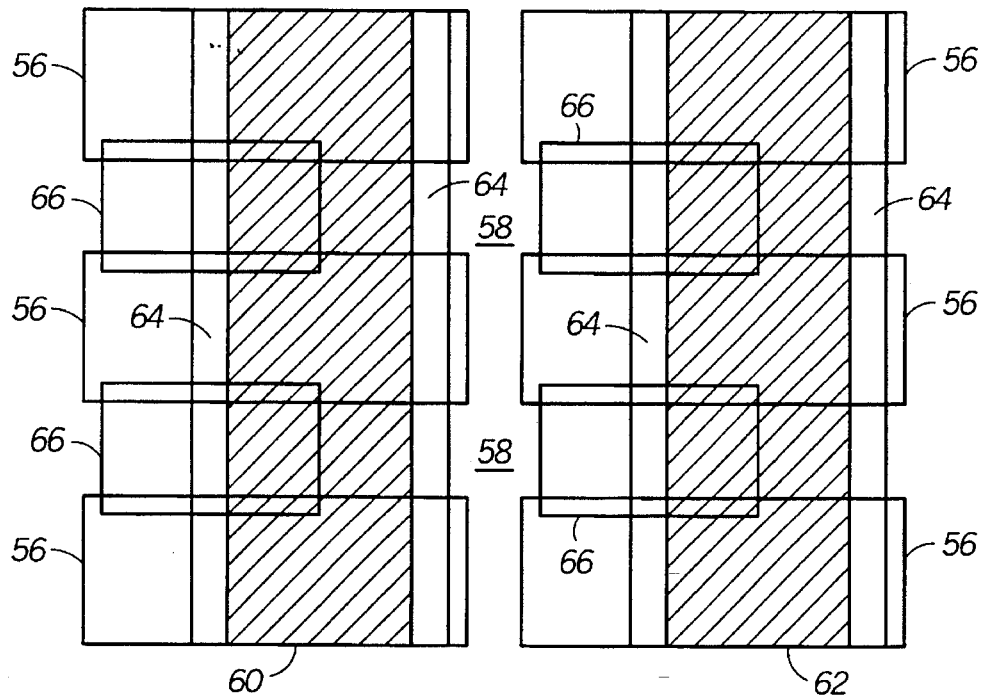
FIG. 11 illustrates, in plan view, a processing step in accordance with an alternative embodiment of the invention for the formation of floating gate sidewall spacers.
Figure 12:
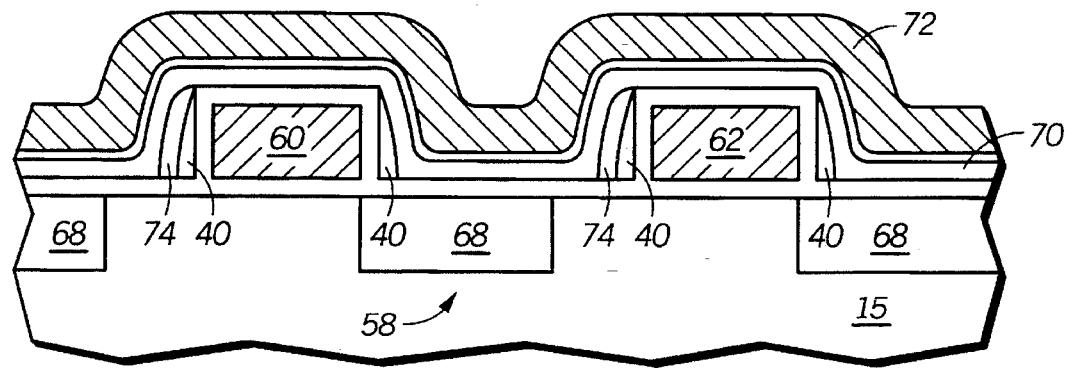
FIG. 12 illustrates, in cross-section, the formation of a select gate electrode in accordance with a further embodiment of the invention in which the select gate electrodes are disposed orthogonally to the control gate electrodes.
Figure 13:
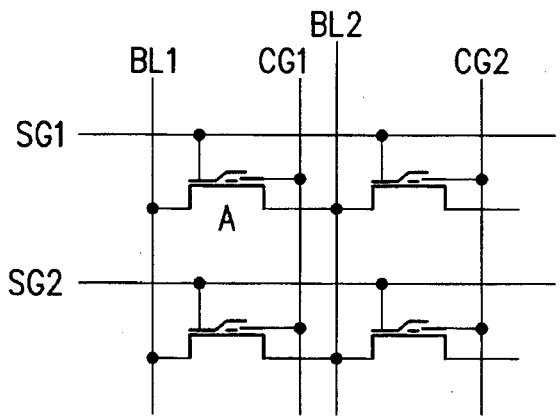
FIG. 13 is a schematic diagram of an EEPROM memory array incorporating the EEPROM device as illustrated in FIG. 12.

The advantages of the various embodiments of the invention can be more fully understood following a description of the fabrication process for an EEPROM memory array arranged in accordance with two embodiments of the invention. FIGS. 3–9 illustrate process steps in accordance with one embodiment of the invention. FIG. 10 illustrates a schematic diagram of a memory array constructed in accordance with the invention, in which individual cells are programmed with source side injection. FIGS. 11–12 illustrate fabrication steps in accordance with an alternative embodiment of the invention. FIG. 13 illustrates a schematic diagram of a memory array constructed in accordance with the invention having a virtual ground architecture, and in which individual cells are programmed with Fowler-Nordheim tunneling.

Figure 3:
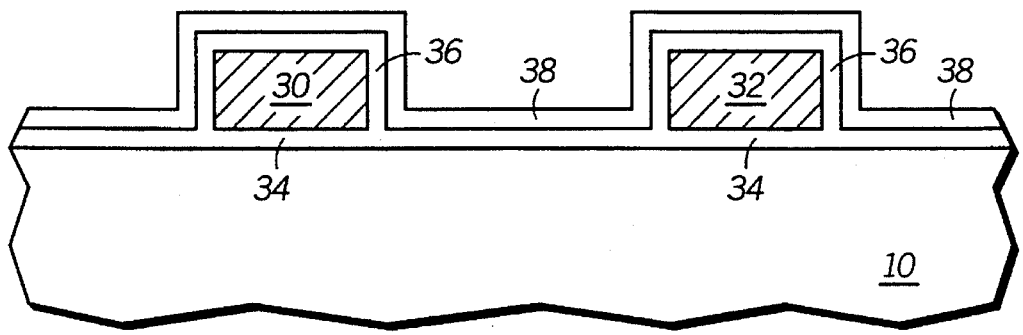
FIGS. 3–5 illustrate, in cross-section, process steps in accordance with the invention.
Figure 4:
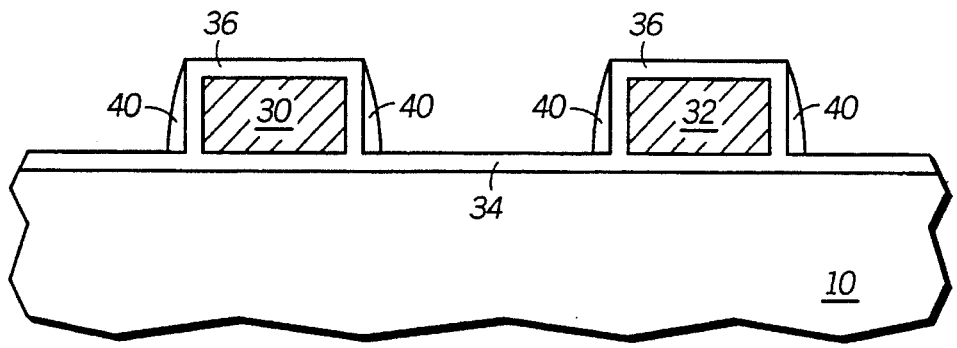

The fabrication sequence common to both embodiments begins with the formation of first and second oxide encapsulated control gate electrodes 30 and 32, as illustrated in FIG. 3. The control gate electrodes are separated from substrate 10 by a first dielectric layer 34. First dielectric layer 34 is preferably formed by thermally oxidizing substrate 10 to grow a silicon dioxide layer having a thickness of about 50 to 120 angstroms. Preferably, control gate electrodes 30 and 32 are formed by depositing a layer of polycrystalline silicon to overlie first dielectric layer 34, then photolithographically patterning and ion etching the polycrystalline silicon layer to form strips of semiconductor material overlying the surface of substrate 10. Following the etch process, control gate electrodes 30 and 32 are encapsulated by a thermally grown silicon dioxide layer 36. The electrodes are further covered by a chemical vapor deposited silicon nitride layer 38. Preferably, silicon nitride layer 38 is deposited to a thickness of about 100–500 angstroms.

Figure 5:
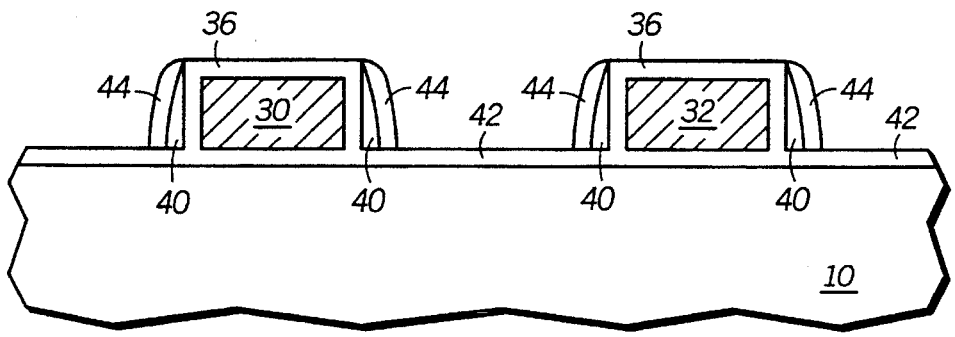

After depositing silicon nitride layer 38, the layer is anisotropically etched to form sidewall spacers 40 adjacent to the vertical wall surfaces of control gate electrodes 30 and 32. The anisotropic etching process selectively etches the silicon nitride, while leaving silicon dioxide layers 34 and 36 substantially unetched. Next, exposed portions of first dielectric layer 34 are removed from the surface of substrate 10. Either a wet chemical etch or a dry plasma etching process can be used to etch away exposed portions of first dielectric layer 34. Once portions of substrate surface 10 are exposed, a thermal oxidation process is carried out to grow a thin tunnel oxide layer 42 on the exposed portions of substrate 10, as illustrated in FIG. 5.

After forming tunnel oxide layer 42, a polycrystalline silicon layer is deposited and anisotropically etched to form sidewall spacers 44 adjacent to control gate electrodes 30 and 32. Sidewall spacers 44 are separated from control gate electrodes 30 and 32 by sidewall spacers 40 and silicon dioxide layer 36. Sidewall spacers 44 overlie a portion of tunnel oxide layer 42 adjacent to control gate electrodes 30 and 32. Preferably, sidewall spacers 44 are formed by the anisotropic etching of a polycrystalline silicon layer having a thickness of about 500 to 1,500 angstroms. Preferably, the polycrystalline silicon layer is doped with a conductivity determining dopant during the deposition process.

Because of the conformal nature of the polycrystalline silicon deposition process, and the directionality of the anisotropic etching process, the width of sidewall spacers 44 overlying the surface of substrate 10 is approximately the same as the thickness of the deposited polycrystalline silicon layer. As will subsequently be described, sidewall spacers 44 will form floating gate electrodes for the EEPROM device under construction. By forming a floating gate electrode using a deposition and anisotropic etching process, the dimensions of the tunnel area underlying the floating gate electrode can be directly controlled by the deposition thickness of the polycrystalline silicon layer. Accordingly, a tunnel oxide window having a width less than about 0.5 microns can be created through control of a chemical vapor deposition process, rather than by a photolithographic masking process. Those skilled in the art will appreciate that, in general, more reliable process control is possible where a lateral dimension can be determined by chemical vapor deposition, rather than photolithographic alignment.

To complete the formation of floating gate electrodes for an EEPROM memory array, portions of sidewall spacers 44 must be removed, such that floating gate electrodes reside adjacent to the control gate electrodes only on active regions of semiconductor substrate 10. The process of selectively etching sidewall spacers 44 to remove all but those portions necessary to form floating gate electrodes is illustrated, in plan view, in FIG. 6. Control gate electrodes 30 and 32, which comprise portions of two large strips of polycrystalline silicon overlie two active regions 46 and 48. A photolithographic mask 50 is defined to overlie a portion of control gate electrodes 30 and 32 and sidewall spacers 44. The photolithographic mask will protect the portions of sidewall spacers 44 underlying the mask during an etching process used to remove exposed portions of sidewall spacers 44.

Figure 6:
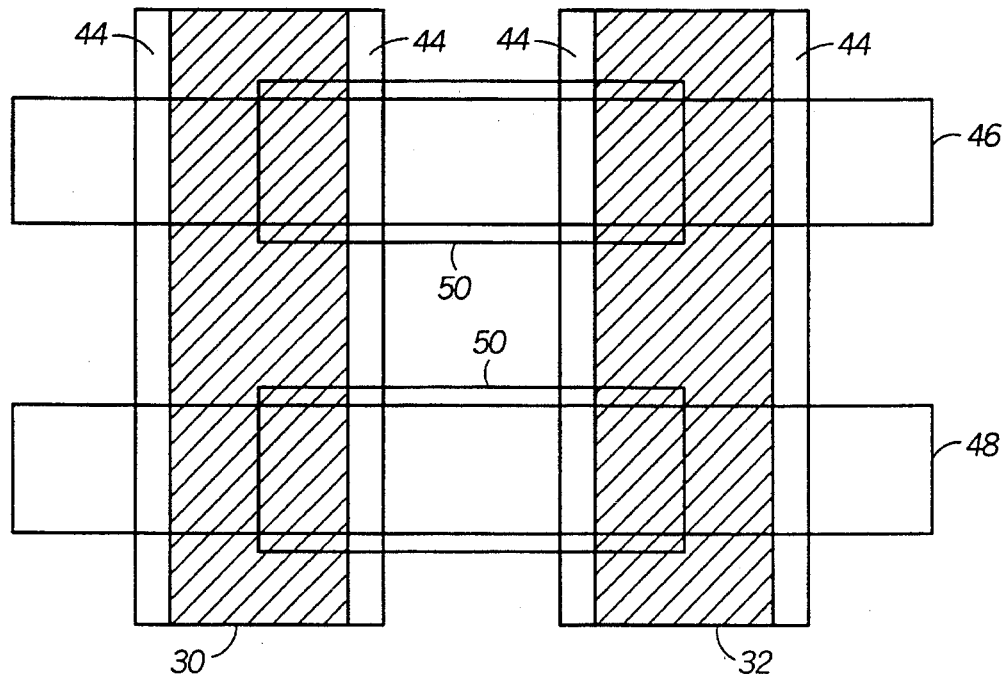
FIG. 6 illustrates, in plan view, a processing step in accordance with the invention for the formation of a floating gate sidewall spacer.

Preferably, a dry, isotropic, plasma etching process can be used to remove exposed portions of sidewall spacers 44. The photolithographic and etching process provides a method for positioning floating gate electrodes in the EEPROM memory array. Those skilled in the art will recognize that considerable process latitude exists for the precise definition and location of floating gate electrodes using the inventive process for the formation of the floating gate electrodes. While the photolithographic masking pattern illustrated in FIG. 6 provides one example of a masking process useful for forming floating gate electrodes, many other geometric configurations are possible and are included within the scope of the present invention.

Following the removal of portions of sidewall spacers 44 to form the floating gate electrodes, an ion implantation process is carried out to form drain regions 45 and 45' in active regions 46 and 48. The drain regions are self-aligned to the edges of control gate electrodes 30 and 32 in regions not protected by photolithographic mask 50. A second insulating layer 52 is deposited to overlie the control gate electrodes and the floating gate electrodes. Second insulating layer 52 is silicon dioxide either grown by thermal oxidation, or deposited by a chemical vapor deposition process. Alternatively, second insulating layer 52 can be a composite layer including a first and second silicon dioxide layer separated by a silicon nitride layer (ONO). The composite ONO layer is formed by sequentially depositing the layers using a chemical vapor deposition process.

Figure 7:
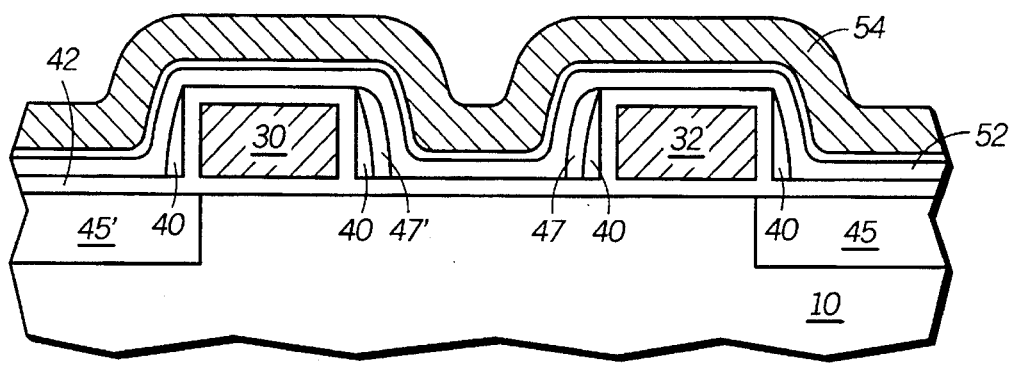
FIGS. 7–8 illustrate, in cross-section, the formation of select gate electrodes in accordance with one embodiment of the invention.

Once second insulating layer 54 is deposited, a second polycrystalline silicon layer 54 is deposited to overlie second insulating layer 52, as illustrated in FIG. 7. As a result of the photolithographic patterning and etching process, floating gate electrodes are formed adjacent to control gate electrodes 30 and 32, and overlie a region of substrate 10 intermediate to control gate electrodes 30 and 32.

Figure 8:
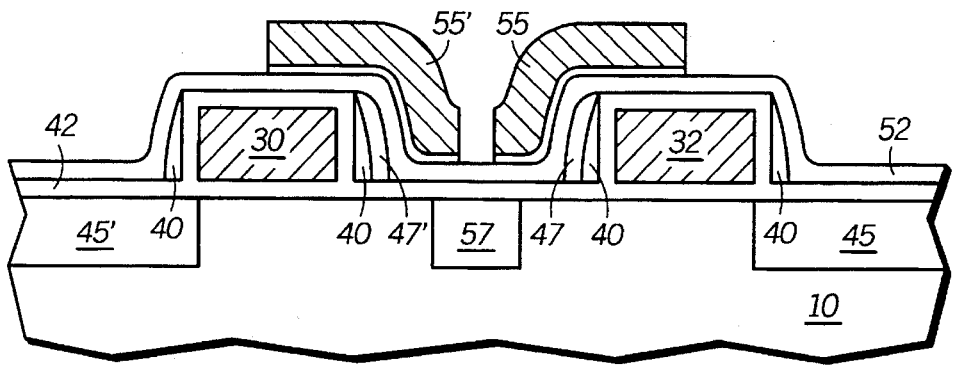

After forming second polycrystalline silicon layer 54, in one embodiment of the invention, a photolithographic mask is defined and second polycrystalline silicon layer is etched to form select gate electrodes 55 and 55', as illustrated in FIG. 8. Select gate electrodes 55 and 55' overlie floating gate electrodes 47 and 47', and a portion of control gate electrodes 32 and 30, respectively. In addition, a portion of select gate electrodes 55 and 55' extend over a portion of substrate 10 intermediate to floating gate electrodes 47 and 47'.

The geometric pattern of select gate electrodes 55 and 55' can be used as an ion implantation mask for the formation of a source region 57 in a portion of substrate 10 intermediate to the floating gate electrodes. The ion implantation process aligns source region 57 to the edges of select gate electrodes 55 and 55'. By defining a portion of the select gate electrodes to overlie a portion of substrate 10 intermediate to the floating gate electrodes, and subsequently aligning source region 57 to the edges of the control gate electrodes produces select gate transistors between source region 57 and the floating gate electrodes. Accordingly, a source region can be provided, which serves many memory cells in an EEPROM array, and which defines the channel region for the select gate transistors in each cell.

Figure 9:
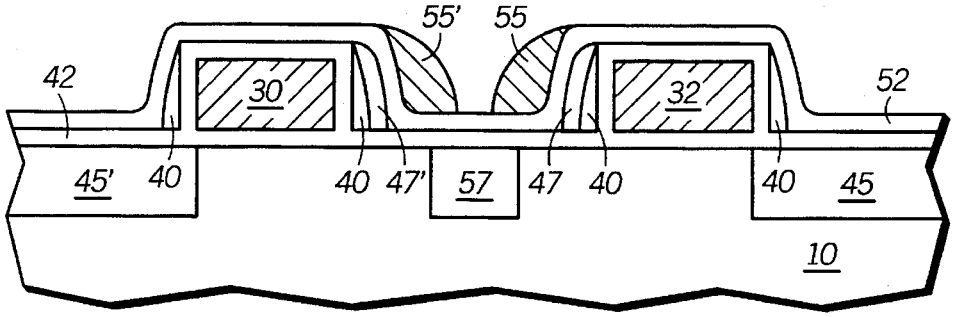
FIG. 9 illustrates, in cross-section, the formation of sidewall spacer select gate electrodes in accordance with another embodiment of the invention.

Another embodiment of the invention is illustrated in FIG. 9. As an alternative to using a photolithographic process to define select gate electrodes 55 and 55', second polycrystalline silicon layer 54 can be anisotropically etched to form the select gate electrodes as sidewall spacers adjacent to floating gate electrodes 47 and 47'. The formation of select gate electrodes and sidewall spacers further reduces the complexity of the fabrication process, and reduces the amount of surface area necessary for the formation of the individual memory cells in an EEPROM array. The anisotropic etch will form sidewall spacers at all vertical surfaces present at the time of the etch. The sidewall spacers formed at locations unnecessary to the functioning of the EEPROM devices can be removed by a masking and isotropic etching process. As in the previous embodiment, the geometric pattern of the control gate electrodes can be used as an implant mask for the definition of a common source region in the EEPROM array.

The embodiment illustrated in FIG. 9 provides an additional advantage in the formation of three gate electrodes for an EEPROM device, which have the equivalent step height of a single layer of polycrystalline silicon. By forming both the floating gate electrodes and the control gate electrodes through the deposition and anisotropic etching of polycrystalline silicon layers, an increase in step height from the surface of substrate 10 is avoided.

In processes of the prior art, it is often necessary to form the gate electrodes in sequentially deposited polycrystalline silicon layers, all overlying a first gate electrode formed on the substrate surface. The sequential deposition and patterning process results in a structure having a large step height on the substrate surface. At the small lateral dimensions typically defined in state of the art memory devices, the large step heights can produce high aspect ratios in contact holes formed through overlying insulating layers. The contact holes are necessary to electrically interconnect the cells in the array to each other and to external circuitry, such as power supplies, charge pump circuitry, row decoders, and the like. Unless the metal deposition and etching process is precisely controlled, voids can develop in the metal interconnects at locations where they traverse high aspect ratio contact openings. By providing a substantially planar EEPROM device, the present invention dramatically reduces the aspect ratio of contact openings used to provide electrical interconnection to an EEPROM array.

A schematic diagram of a portion of an EEPROM array formed in accordance with the present invention is illustrated in FIG. 10. In the layout, the polycrystalline silicon strips the control gate electrodes and select gate electrodes are disposed parallel to one another on the substrate surface. The bit-lines and the source region run parallel to one another and are disposed orthogonal to the source gate and control gate electrodes. The operational voltages used to program, erase, and read data for a selected cell A of the EEPROM array are shown in Table I.

TABLE I

| | BL1 | BL2 | CG1 | CG2 | SG1 | SG2 | s |
|---|---|---|---|---|---|---|---|
| Program | 5 | 0 | 10 | 0 | 1.5 | 0 | 0 |
| Erase | 0 | 0 | −12 | 0 | −12 | 0 | 0 |
| Read | 2 | 0 | Vcc | 0 | Vcc | 0 | 0 |

In the EEPROM memory array illustrated in FIG. 10, source side injection is used to program cell A. Accordingly, about 10 volts is applied to control gate electrode 30 (CG1), about 5 volts is applied to drain region 45' (BL1), and about 1.5 volts is applied to select gate 55' (SG1), while grounding source region 57 (S). Under the applied voltage conditions, electrons traverse the channel region below select gate electrode 30 and are injected across the tunnel oxide layer and into floating gate electrode 47'. Cell A is erased by applying about −12 volts to control gate 30 and select gate 55', while grounding drain region 45' and source region 57. Data is read from cell A by applying power supply voltages, denoted as Vcc, to control gate 30 and select gate 55', and by applying about 2 volts to drain region 45', while grounding source region 57.

As previously discussed, another aspect of the invention includes the formation of an EEPROM memory cell that can be programmed and erased by Fowler-Nordheim tunneling from floating gate electrode 22 to substrate 10 through tunnel oxide layer 42.

The fabrication of an EEPROM array using a charge tunneling write and erase mechanism utilizes an active region partitioned by a plurality of field oxide regions 56, as illustrated in the plan view of FIG. 11. An active region 58 is partitioned by field oxide regions 56 such that active region 58 is characterized by a series of orthogonal channels in the substrate. Control gate electrodes 60 and 62 are formed in a manner substantially the same as that described in the previous embodiment. After forming sidewall spacers 64, a photolithographic mask 66 is defined to overlie portions of control gate electrodes 60 and 62, as illustrated in FIG. 11. An etching process is then performed to remove portions of sidewall spacer 64 that are exposed by photolithographic mask 66.

After removing unprotected portions of sidewall spacer 64, an ion implantation process is performed to form bit line 70 in substrate 15, as illustrated in FIG. 12. Next, a silicon nitride layer 70 and a second polycrystalline silicon layer 72 are sequentially deposited to overlie control gate electrodes 60 and 62. Once second polycrystalline silicon layer 72 is deposited, a photolithographic and etching process is performed to pattern second polycrystalline silicon layer 72 into a series of lines overlying substrate 15 and running orthogonal to the control gate electrodes. A schematic diagram of the array is illustrated in FIG. 13. Data operations for a selected cell A are shown in Table II.

TABLE II

|  | BL1 | BL2 | CG1 | CG2 | SG1 | SG2 |
|---|---|---|---|---|---|---|
| Program | 0 | 0 | 14 | 0 | 14 | 0 |
| Erase | 0 | 0 | −12 | 0 | −12 | 0 |
| Read | 0 | 2 | Vcc | 0 | Vcc | 0 |

To program cell A by Fowler-Nordheim tunneling, positive voltages of about 14 volts are applied to control gate 60 (CG1) and select gate 72 (SG1), while grounding drain regions 68 (BL11, BL12). Under the applied voltage conditions, electrons tunnel from active region 58 across the thin tunnel oxide and into floating gate electrode 74, shown in FIG. 12. Selected cell A is erased by applying about −12 volts to both control gate 60 and select gate 72, while grounding drain regions 68. Data is read from selected cell A by applying power supply voltages to CG1 and SG1, and about 2 volts to BL12, while grounding BL11. It is important to note that the operating voltages can be supplied from a single power supply operating at 5 volts and coupled to the array through charge pump and polarity switching circuitry.

Optimal performance from an EEPROM array in which data is programmed and erased by charge tunneling is obtained by arranging source gate lines and control gate lines at right angles to each other on a substrate surface. The orthogonal arrangement of control gate lines and select gate lines is known in the art as cross-point architecture. For example, during programming or erase of cell A, shown in FIG. 13, the cross-point of identifies a cell A by bringing SG1 and CG1 to 14 volts. Since the lines are orthogonal to each other, only cell A, located at the cross point, will be affected. The remaining cells will not have both gate electrodes at high voltage and therefore will not be programmed.

Thus it is apparent that there has been provided, in accordance with the invention, an EEPROM memory array which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, other materials can be used for the formation of the gate electrodes, such as a refractory-metal silicide in combination with polysilicon. Further, additional substrate doping steps can be carried out to form drain extensions, graded junctions, and the like. It is therefore intended to include within the invention all such variations and modifications as fall within the scope of the appended claims and equivalents thereof.

We claim:

1. Method for fabricating an EEPROM memory array comprising the steps of:

providing a semiconductor substrate having an active region therein;

forming first and second oxide encapsulated control gate electrodes overlying the active region;

forming a tunnel oxide layer overlying the substrate intermediate to the first and second control gate electrodes;

forming floating-gate sidewall spacers adjacent to the first and second control gate electrodes and overlying a portion of the tunnel oxide layer;

forming an insulating layer overlying the first and second control gate electrodes and the floating-gate sidewall spacers;

forming first and second select gate electrodes intermediate to sidewall spacers and separated therefrom by the insulating layer; and doping the substrate to form a source in the semiconductor substrate intermediate to the first and second floating gate electrodes, using the first and second select gate electrodes as a doping mask.

2. The method of claim 1, wherein the step of forming semiconductor sidewall spacers comprises the steps of:

depositing a layer of semiconductor material to overlie the first and second control gate electrodes;

anisotropically etching the semiconductor layer to form sidewall spacers adjacent to the first and second control gate electrodes;

forming an etching mask to protect a portion of the active region and a portion of the sidewall spacers intermediate to the first and second control gate electrodes; and etching away unprotected portions of the sidewall spacers.

3. The method of claim 1, wherein the step of forming first and second select gate electrodes comprises the steps of:

depositing a layer of semiconductor material to overlie the insulating layer; and etching the semiconductor layer to form first and second opposing portions thereof, wherein each opposing portion overlies a portion of the active region, the sidewall spacer, and a portion of the control gate electrode, and wherein each opposing portion is separated from the active region by the insulating layer.

4. The method of claim 1, wherein the step of forming first and second select gate electrodes comprises the steps of:

depositing a layer of semiconductor material to overlie the insulating layer; and anisotropically etching the semiconductor layer to form sidewall spacers overlying a portion of the active region adjacent to the floating-gate sidewall spacers and separated from the active region by the insulating layer.

* * * * *